(12) United States Patent
Masuko

(10) Patent No.: US 7,982,230 B2
(45) Date of Patent: Jul. 19, 2011

(54) SUBSTRATE FOR MOUNTING LIGHT EMITTING ELEMENT, LIGHT EMITTING MODULE AND LIGHTING APPARATUS

(75) Inventor: Koichiro Masuko, Sakura (JP)

(73) Assignee: Fujikura Ltd., Tokyo (JP)

( * ) Notice: Subject to any disclaimer, the term of this patent is extended or adjusted under 35 U.S.C. 154(b) by 574 days.

(21) Appl. No.: 11/953,522

(22) Filed: Dec. 10, 2007

(65) Prior Publication Data

US 2008/0258169 A1    Oct. 23, 2008

Related U.S. Application Data

(63) Continuation of application No. PCT/JP2006/311614, filed on Jun. 9, 2006.

(30) Foreign Application Priority Data

Jun. 13, 2005 (JP) .................................. 2005-172202

(51) Int. Cl.
*H01L 33/00* (2010.01)
(52) U.S. Cl. ..... 257/98; 257/99; 257/100; 257/E29.072; 257/E33.008; 257/E25.032
(58) Field of Classification Search ............ 257/98–100, 257/E29.072, E33.008
See application file for complete search history.

(56) References Cited

U.S. PATENT DOCUMENTS

| | | | |
|---|---|---|---|
| 4,256,796 A | 3/1981 | Hang et al. | |
| 4,935,665 A * | 6/1990 | Murata | 313/500 |
| 5,150,016 A * | 9/1992 | Sawase et al. | 315/294 |
| 5,564,819 A | 10/1996 | Yamaguchi | |
| 6,517,218 B2 | 2/2003 | Hochstein | |
| 6,617,520 B1 | 9/2003 | Martter et al. | |
| 6,884,646 B1 | 4/2005 | Wu et al. | |
| 7,241,030 B2 | 7/2007 | Mok et al. | |
| 7,699,500 B2 | 4/2010 | Takemoto et al. | |
| 2001/0030866 A1 | 10/2001 | Hochstein | |
| 2003/0189829 A1 | 10/2003 | Shimizu et al. | |
| 2003/0189830 A1 | 10/2003 | Sugimoto et al. | |
| 2003/0193055 A1 | 10/2003 | Martter et al. | |
| 2003/0219919 A1 | 11/2003 | Wang et al. | |
| 2005/0180142 A1 | 8/2005 | Tsai | |
| 2005/0199899 A1 | 9/2005 | Lin et al. | |

FOREIGN PATENT DOCUMENTS

| | | |
|---|---|---|
| JP | 59-009982 A | 1/1984 |
| JP | 62-84942 U | 5/1987 |
| JP | 64-28886 A | 1/1989 |
| JP | 3-209781 A | 9/1991 |
| JP | 3-258158 A | 11/1991 |
| JP | 4-88694 A | 3/1992 |

(Continued)

*Primary Examiner* — Samuel A Gebremariam
(74) *Attorney, Agent, or Firm* — Sughrue Mion, PLLC

(57) ABSTRACT

A substrate for mounting light emitting elements having two or more conductive layers and an insulating layer provided between each conductive layer, which are formed on the outside of an enameled substrate, the enameled substrate being an enamel layer covering the surface of a core metal. The conductive layer provided on the enamel layer side links one end of enameled substrate to the other end, and feeds power to a plurality of light emitting elements mounted in the longitudinal direction of the conductive layer. Furthermore, the conductive layer on the surface of a protruding section provided at both ends of the enameled substrate extends and forms a connection with another substrate. A light emitting module is formed by mounting light emitting elements on the substrate.

5 Claims, 4 Drawing Sheets

FOREIGN PATENT DOCUMENTS

| | | |
|---|---|---|
| JP | 5-299701 A | 11/1993 |
| JP | 06-320790 A | 11/1994 |
| JP | 10-98215 A | 4/1998 |
| JP | 2890809 A | 2/1999 |
| JP | 2890809 B2 | 5/1999 |
| JP | 2002-9349 A | 1/2002 |
| JP | 2002-232009 A | 8/2002 |
| JP | 2004-55160 A | 2/2004 |
| JP | 2004-55229 A | 2/2004 |
| JP | 2004-079750 A | 3/2004 |
| JP | 2004-146411 A | 5/2004 |
| KR | 10-2003-0085489 A | 11/2003 |
| TW | 553479 | 9/2003 |
| TW | I224876 | 12/2004 |
| TW | I232565 B | 5/2005 |

* cited by examiner ical fields such as lighting. The substrate for mounting light emitting elements of the present invention has excellent extensibility, good heat dissipating ability and is easy to connect to a different substrate, whereupon a plurality of light emitting elements can be mounted with only the circuit pattern in the substrate.

SUBSTRATE FOR MOUNTING LIGHT EMITTING ELEMENT, LIGHT EMITTING MODULE AND LIGHTING APPARATUS

CROSS REFERENCE TO RELATED APPLICATION

This application claims priority from PCT Application No. PCT/JP2006/311614, filed Jun. 9, 2006 and from Japanese Application No. 2005-172202 filed Jun. 13, 2005, which applications are incorporated herein by reference.

TECHNICAL FIELD

The present invention relates to a substrate for mounting a plurality of light emitting elements, such as light emitting diodes (hereafter referred to as "LED") thereon, especially applications thereof such as lighting, substrate for mounting light emitting elements that can supply current to a plurality of light emitting elements by only conductive layers in the substrate without running separate wiring while ensuring heat dissipating ability when light emitting elements are mounted at a high density, light emitting module mounted with light emitting elements mounted on said substrate, and lighting apparatus provided with such light emitting modules.

BACKGROUND ART

Adequate brightness cannot be obtained when one light emitting module is used as the illuminating light source in lighting applications such as a light emitting module mounted with light emitting elements such as LEDs on the substrate; thus, a plurality of light emitting modules are disposed in rows. In such cases, each light emitting module is connected with individual wire, or each light emitting module is connected to the connector formed on a large lighting apparatus unit, and the required power supply is supplied to the light emitting modules (for example, refer to Patent Document 1).

Further, Patent Documents 2 and 3 propose for example, the examples of enameled substrates using electronic circuit configuration.

Patent Document 1: Japanese Unexamined Patent Application, First Publication No. 2004-55160
Patent Document 2: Japanese Patent No. 2890809
Patent Document 3: Japanese Unexamined Patent Application, First Publication No. H4-88694

When a plurality of light emitting modules mounted on a substrate with light emitting elements such as LEDs are put together and used, it is convenient to run wiring for supplying power (electric wire) to each light emitting module if the number of light emitting modules used is about two or three. However, if a large number of light emitting modules is assembled, running wires separately from the substrate, whereupon light emitting modules are mounted, becomes complicated and leads to an increase in the cost. Also, if the wires are stored within a lighting apparatus to ensure that the wiring does not receive external damage, then design restrictions will be imposed on the lighting apparatus because of this storage space.

Especially, since the temperature of the substrate increases because of heat emitted by the LED element in a light emitting module using LEDs, if wires are fitted on the rear face of the substrate, deterioration of the insulating material of the wires may be accelerated.

Moreover, when wires for transmission are formed on the front face of the substrate, since they should share the space with other electric circuits, the width of the substrate itself must be increased to ensure adequate width for the wires. This leads to the problem of increase in the size of the apparatus.

The present invention has been made in light of the foregoing circumstances, and an aspect of the present invention is to provide: substrate for mounting light emitting elements with excellent extensibility, good heat dissipating ability and easy to connect to a different substrate, whereupon a plurality of light emitting elements can be mounted with only the circuit pattern in the substrate; light emitting module formed by mounting light emitting elements on the substrate; and lighting apparatus.

SUMMARY OF EXEMPLARY EMBODIMENTS OF THE INVENTION

A first aspect of the present invention provides a substrate for mounting light emitting elements is provided, comprising an enameled substrate in which the surface of a core metal is covered with an enamel layer; wherein two or more conductive layers and an insulating layer provided between every two of the conductive layers are formed on the outside of the enameled substrate; wherein the conductive layer disposed at an enamel layer side is provided extending through the enameled substrate from one end to the other end such that it feeds power to a plurality of light emitting elements mounted along a longitudinal direction of the conductive layer; and wherein the conductive layer extends on the surface of a protruding section provided at both ends of the enameled substrate and forms a connection with another substrate.

In a non-limiting embodiment, in the substrate for mounting light emitting elements according to the present invention, at least part of the conductive layer on which the light emitting elements are mounted is directly formed on the enamel layer which covers the surface of core metal.

In another non-limiting embodiment, in the substrate for mounting light emitting elements according to the present invention, a groove is provided in the enameled substrate, wherein, of the conductive layers, the outside conductive layer is formed such that a part thereof extends within the groove and that the position for mounting the light emitting element is provided on the conductive layer formed on the groove.

In yet another non-limiting embodiment of the present invention, a light emitting module is provided comprising light emitting elements which are mounted on the substrate for mounting light emitting elements according to the present invention as recited above.

Furthermore, in a non-limiting embodiment of the present invention, a lighting apparatus is provided comprising the light emitting module of the present invention as recited above.

The substrate for mounting light emitting elements of the present invention has two or more conductive layers and insulating layer provided between each conductive layer that were formed on the outside of an enameled substrate, which is an enamel layer covering the surface of a core metal. It also has a conductive layer provided on the enamel layer side that links one end of the enameled substrate to the other end, and feeds power to a plurality of light emitting elements mounted in the longitudinal direction of the conductive layer. Also, a conductive layer on the surface of a protruding section provided at both ends of the enameled substrate extends and forms a connection with another substrate. As a result, the heat dissipating ability is good, and a plurality of light emitting element can be mounted with using conductive layers within the substrate and without running separate wires.

Moreover, connection with another substrate can be easily made, and a substrate for mounting light emitting elements with excellent extensibility can be provided.

Also, the light emitting module and lighting apparatus of the present invention make use of the substrate for mounting light emitting elements of the present invention, and are mounted with a plurality of light emitting elements using the conductors in the substrate without running separate wires; therefore, they can be made compact and provided at an economical cost. Moreover, connection with a separate light emitting module through the connection terminal of the substrate can be made easily; so a plurality of links can be made longitudinally and transversely without a gap, thus enabling lighting apparatus of large area to be realized easily.

The aspects, operation and effects of the present invention mentioned above and others should be clear to the person skilled in the art from the attached drawings and the embodiments of the present invention described above.

DETAILED DESCRIPTION OF EXEMPLARY EMBODIMENTS OF THE INVENTION

Figure 1:
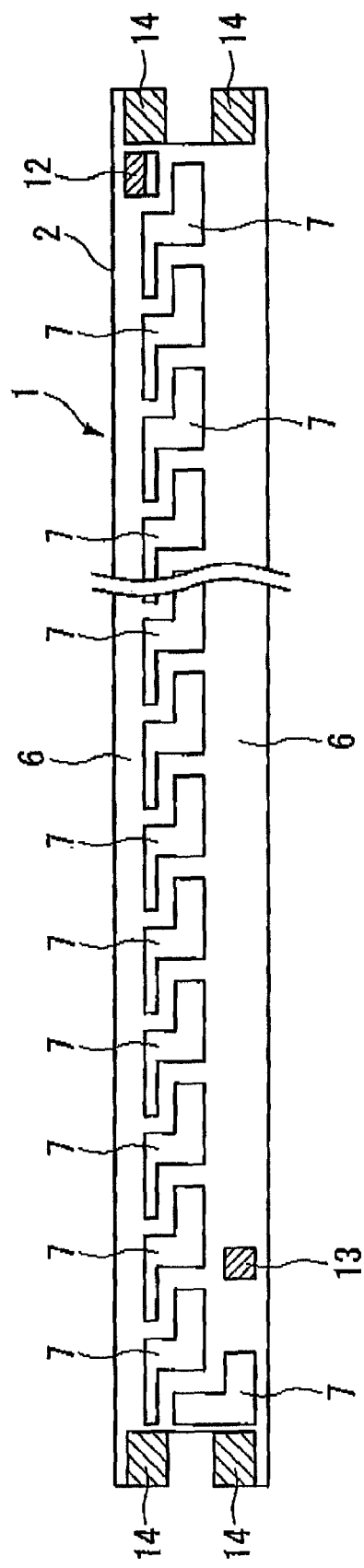
FIG. 1 is a plan view illustrating a first embodiment of a substrate for mounting light emitting elements of the present invention.

Non-limiting, exemplary embodiments of the present invention are described here referring to the drawings.

Figure 2:
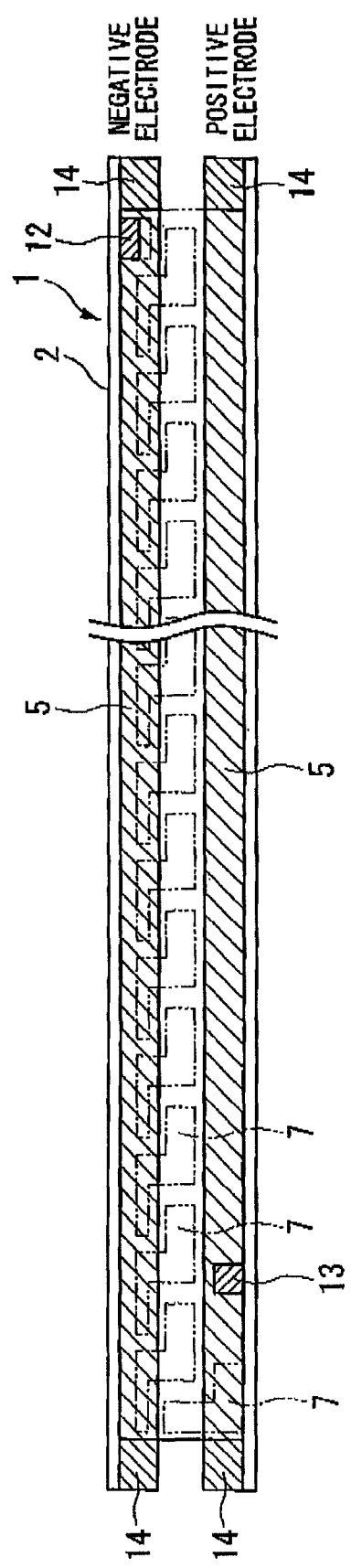
FIG. 2 is a perspective view illustrating a first conductive layer in the substrate for mounting the light emitting elements of FIG. 1.

FIG. 1 and FIG. 2 show the first embodiment of the substrate for mounting light emitting elements of the present invention. FIG. 1 shows the plan view of the substrate 1 for mounting light emitting elements and FIG. 2 is a perspective view showing the position of formation of the first conductive layer 5 in the substrate 1 for mounting light emitting elements.

Figure 3:
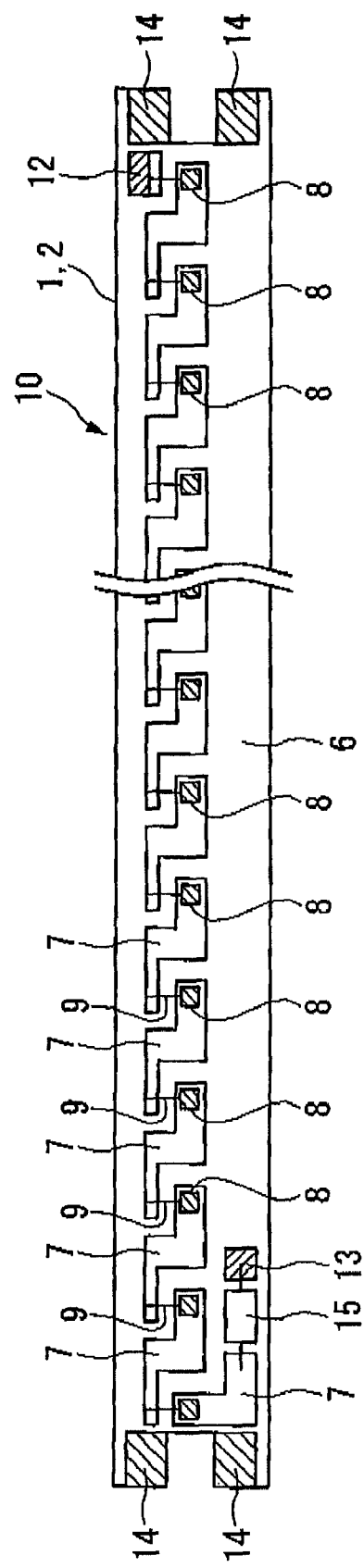
FIG. 3 is a plan view illustrating one example of a light emitting module of the present invention.
Figure 4:
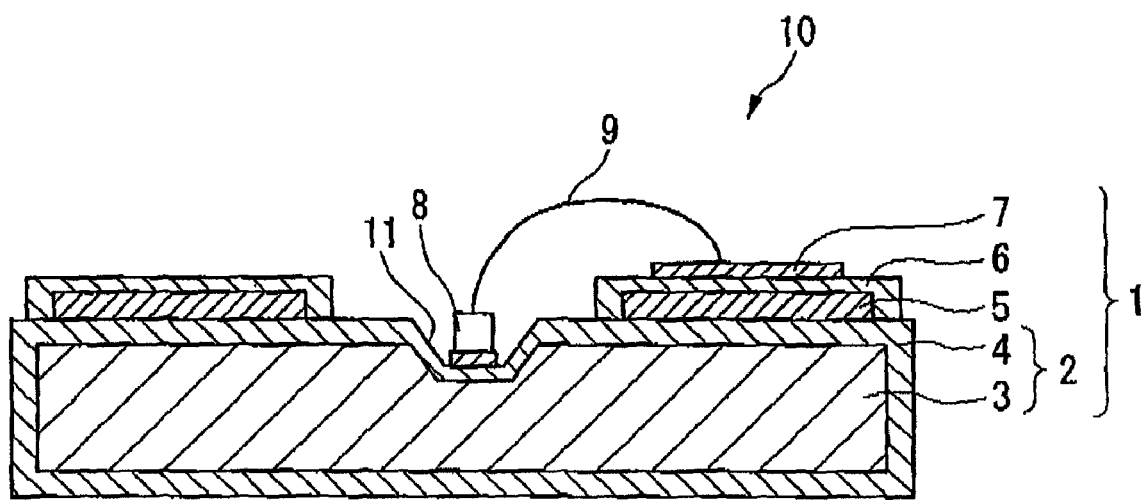
FIG. 4 is a cross-sectional view of the light emitting module of FIG. 3.

FIG. 3 and FIG. 4 are figures that show the first embodiment of the light emitting module of the present invention. FIG. 3 shows the plan view of the light emitting module 10 formed by mounting a plurality of light emitting elements 8 on the substrate 1 for mounting light emitting elements shown in FIG. 1, and FIG. 4 is the cross-sectional view of the light emitting module 10.

The substrate 1 for mounting light emitting elements of the present embodiment is formed by sequentially laminating a first conductive layer 5, a second enamel layer 6, and a second conductive layer 7 on the outside of an enameled substrate 2 formed by a first enamel layer 4 covering the surface of core metal 3. As shown in FIGS. 2 and 4, two of the first conductive layers 5 are provided on the first enamel layer 4 parallel to and along the longitudinal direction of the enameled substrate 2. Each of the first conductive layers 5 forms a link from one end to the other end of the enameled substrate 2, and supplies power to the plurality of light emitting elements 8 mounted along and in the longitudinal direction of the first conductive layer 5. Also, the first conductive layer 5 on the surface of a protruding section provided at both ends of the enameled substrate 2 extends and constitutes a connection terminal 14 that forms a connection with another substrate. The intermediate section is omitted, but the construction in the present embodiment is such that 30 light emitting elements 8 are series-connected.

In the substrate 1 for mounting light emitting elements of the present embodiment, the material of the core metal 3 may be metal such that an enamel layer can be securely formed on a surface of the core metal, and is not specially limited to a specific metal; for example, steel plate may be used. Further, the first enamel layer 4 and the second enamel layer 6 are formed by fusing glass powder. The first conductive layer 5 and the second conductive layer 7 may be formed by methods such as printing and baking conductive silver paste along a specific pattern by a method such as screen printing method.

As shown in FIG. 4, a groove 11 is provided in the enameled substrate 2 of the substrate 1 for mounting light emitting elements of the present invention, which becomes the mounting position of the light emitting element along the longitudinal direction of the enameled substrate 2. This groove 11 is provided between the two first conductive layers 5, and includes a base surface that becomes the position for mounting light emitting element and a tapering wall face.

The outermost second conductive layer 7 of the substrate 1 for mounting light emitting elements of the present embodiment has an approximate "Z" shape, as shown in FIG. 1, and a plurality of layers are disposed adjacent to each other along the longitudinal direction of the enameled substrate 2. A part of the second conductive layer 7 extends along the base surface of groove 11 mentioned above, and forms the position for mounting light emitting element. The second conductive layer 7 formed in the groove 11 is installed directly on the first enamel layer 4. The parts other than the groove 11 of the second conductive layer 7 are formed on the second enamel layer 6, which is formed on one of the two rows of first conductive layers 5. Moreover, the second conductive layer 7, provided near the end of the enameled substrate 2, is "L" shaped, and a part thereof is formed on the second enamel layer 6, formed on one of the two rows of the first conductive layer 5.

A plurality of holes which lead to the first conductive layer 5 are provided in the second enamel layer 6. These holes are filled with thick silver paste and baked, or are filled with solder to form the conductive layer connections 12 and 13 for connecting the upper and lower conductive layers.

As set forth above, at the two ends of the enameled substrate 2, two connection terminals 14 for negative and positive electrode respectively are formed as protrusions. The first conductive layer 5 extends on either one or both the front and rear faces of these connection terminals 14. The two ends of the first conductive layer 5 are electrically connected to the connection terminal 14 for connecting the power supply to the substrate and for connection to a different substrate.

In the present embodiment, a conductive layer for one row of series-connected circuits is provided, but a plurality of rows of series-connected circuits may be formed in the substrate according to the number of light emitting elements 8 mounted. For example, a construction with 30 light emitting elements connected in series maybe formed in two or more rows.

The substrate 1 for mounting light emitting elements of the present embodiment is configured as mentioned above, and thus, it has good heat dissipating ability. Also, a plurality of light emitting elements 8 can be mounted using the conductive layers 5, 7 in the substrate without running separate wires, and moreover, it can be connected easily to a different substrate, and has good extensibility.

The first embodiment of the light emitting module of the present invention is described here referring to FIG. 3 and FIG. 4. The light emitting module 10 of the present embodiment is configured by mounting a plurality of light emitting elements 8 on the substrate 1 for mounting light emitting elements, as shown in FIG. 1. Each light emitting element 1 is mounted on the second conductive layer 7 extending within the groove 11 of the substrate 1 for mounting light emitting elements, that is, at the mounting position of the light emitting elements.

In a non-limiting embodiment, a LED is used as the light emitting element 8 in the light emitting module 10. Further, a white LED may be used as the light emitting element 8 when the light emitting module 10 is applied to a lighting apparatus. It is desirable to use, as this white LED, a white LED which is formed by combining a blue LED made from gallium nitride-based semiconductor and a single or two or more different fluorescent materials that emit visible light other than blue light, such as yellow light excited by blue light and the like. Incidentally, it is desirable that the aforesaid fluorescent material is mixed and dispersed in transparent resin for sealing off the light emitting element 8 mounted on the substrate.

By mounting each light emitting element 8 in the light emitting module 10 of the present embodiment on the second conductive layer 7 extending on the base surface of groove 11, one of the electrode terminals of the light emitting element 8 is electrically connected to the second conductive layer 7. Moreover, one of the electrode terminals of the light emitting element 8 is electrically connected to the end of the adjacent second conductive layer 7 by a bonding wire 8 such as thin metallic wire. From the light emitting elements 8 mounted on both ends in the longitudinal direction of the enameled substrate 2, one end of the light emitting element 8 is connected to one of the conductive layer connections 12 by a bonding wire 9. Also, the light emitting element 8 on the other end is mounted on the second conductive layer 7 in "L" shape. This second conductive layer 7 is connected to the other conductive layer connection 13 through the adjusting circuit 15 for current adjustment and protection of the elements. As a result, the plurality of light emitting elements 8 mounted on the substrate 1 for mounting light emitting elements, is series-connected in a row. As shown in FIG. 2, by applying voltage between the connection terminal 14, which becomes the negative electrode, and the other connection terminal 14, which becomes the positive electrode, all the light emitting elements 8 mounted on the substrate can be supplied with power and made to emit light.

Hereinbelow, the production method of the substrate 1 for mounting light emitting elements mentioned above and the light emitting module 10 is described.

Firstly, a metallic plate for making core metals is arranged, and is cut into strips, each of which is then mechanically processed to form a groove 11 that becomes the position for mounting a light emitting element. Both ends of each thereof are then processed into a horseshoe shape so as to form the connection terminal 14, and as a result, the core metal 3 is manufactured.

Next, this core metal 3 is immersed in liquid in which glass powder has been dispersed in appropriate solvent, opposing electrodes are arranged in the neighborhood, voltage is applied between the core metal 3 and the opposing electrodes, and the glass powder is electrodeposited on the surface of the core metal 3. After the electrodeposition, the core metal 3 is pulled out of the liquid and dried, placed in a heating furnace and heated to the specified temperature, the glass powder on the surface of the core metal 3 is baked, the first enamel layer 4 is formed and the enameled substrate 2 is manufactured.

Next, thick silver paste is printed on one surface of the enameled substrate 2, along the formed first conductive layer pattern shown in FIG. 2 by a method such as screen printing, subsequently fused, and the first conductive layer 5 and the connection terminal 14 are formed.

Next, similar to the formation of the first enamel layer 4 mentioned above, the substrate is immersed in liquid dispersed with glass powder, voltage is applied between the first conductive layer 5 and the opposing electrodes, and glass powder is electrodeposited on the surface of the first conductive layer 5. At this stage, the parts that become conductive layer connections 12, 13 are either masked such that they are not electrodeposited by glass powder or the glass powder is removed after the electrodeposition. After drying this substrate, it is heated to the specified temperature, glass is fused and the second enamel layer 6 is formed.

Next, through a method such as screen printing, along the formed second conductive layer pattern shown in FIG. 2, thick silver paste is printed and subsequently exposed to thereby form the second conductive layer 7 and the conductive layer connection terminals 12 and 13. By implementing each of the processes described above, the substrate 1 for mounting light emitting elements shown in FIG. 1 is obtained.

The light emitting module 10 shown in FIG. 3 can be obtained by mounting the light emitting elements 8 by die bonding at the specified positions of the substrate 1 for mounting light emitting elements manufactured as described above, by forming the adjusting circuit 15, and by electrically connecting the each of the light emitting elements and the second conductive layer 7 by wire bonding.

Subsequently, the light emitting element 8 may be sealed by using resin for protection, or by filling and curing resin wherein fluorescent material is mixed and dispersed, in the groove 11.

The light emitting element 8 in the light emitting module 10 of the present embodiment is mounted on the second conductive layer 7 extending directly on the first enamel layer 4 in the groove 11. Therefore, the heat generated in the light emitting element 8 is easily transmitted to the core metal 3, and the heat dissipating ability is good. Also, since a conductive layer and additional enamel layer are formed on the rear face of the enameled substrate 2, there are no effects of heat dissipation due to thermal conduction from the rear face of the enameled substrate 2, and moreover, no potential difference is generated in the rear face of the enameled substrate 2. Therefore, it is safe to fix it even on a metal case.

When actually used, this light emitting module 10 may be secured to a long metal-sheet casing or structure. An example is such that an adapter is attached to each end of the module, the module is retained through the adapters, and substrates next to each other are electrically connected within each of the adapters. In this way, even if ten or several dozen light emitting modules are arranged in a row and connected and power is supplied only to one module on the far end from a single power source, all the modules can receive the power. Moreover, by ensuring adequate width in the first conductive layer 5, adequate power can be supplied to modules distant from the power source also, and there is no darkness at a distance from the power source also.

The present invention is not limited to the embodiment mentioned above and various changes and modifications can be made. For example, the light emitting elements may be arranged in 4 rows, and the first conductive layer 5 may be provided in the lower layer in the part that has no rows of light emitting elements. The first conductive layer 5 may have any number of rows greater than 2. With the use of the formation of two-dimensional arrays, large amount of light can be processed in a single module.

The first conductive layer 5 may be used only as one of the electrodes. The other electrode may be electrically connected to the core metal 3, and this core metal may itself be used as feed wire or wiring for supplying power to the substrate. As a result, a larger area of the feed wire can be taken.

The light emitting module 10 has a plurality of light emitting elements 8 mounted thereon using the substrate 1 for mounting the light emitting elements mentioned above, and using the conductor in the substrate without running wires separately, so it can be provided as a compact and economical module. Moreover, connection with a separate light emitting module 10, not illustrated, through the connection terminal 14 can be made easily; therefore, plurality of links can be made longitudinally and transversely without a gap, thus enabling lighting apparatus of large area to be realized easily. The power from one end can be sequentially fed to the adjacent light emitting module without any significant drop in voltage, and therefore, power can be supplied easily to a plurality of light emitting modules 10.

Non-Limiting Examples

A steel plate of 2 mm in thickness was cut out into strips, and then, the strips were mechanically processed. A groove that becomes the position for mounting light emitting elements was formed on each strip. Both ends of each thereof were processed into a horseshoe shape so that connection terminals were formed, and then, the core metal was manufactured.

Next, glass was electrodeposited on the surface of the core metal mentioned above and was fused. The surface of the core metal was covered by a first enamel layer with a thickness of about 100 μm, and an enameled substrate was manufactured.

Next, on one surface of the enameled substrate, thick silver paste was printed according to the pattern formed on the first conductive layer shown in FIG. 2 by screen printing, subsequently baked and formed as the first conductive layer with a thickness of about 30 μm.

Next, voltage was impressed on the first conductive layer, glass was electrodeposited and subsequently fused. As a result, the second enamel layer with a thickness of about 100 μm was formed on the surface of the first conductive layer.

Next, on one surface of the enameled substrate, thick silver paste was printed according to the pattern formed on the first conductive layer shown in FIG. 1 by screen printing, subsequently exposed and formed as the first conductive layer with a thickness of about 30 μm.

The substrate for mounting light emitting elements manufactured in this way had an overall length of 300 mm, width of 20 mm, thickness of about 1.5 mm, width of groove bottom part of 1.0 mm, angle of inclination of side wall of groove of 45 degrees, length of connection terminal of 7 mm, width of connection terminal of 7 mm, width of the first conductor of 5 mm, and the number of second conductors formed as 30.

Thirty blue LEDs with central light emitting wavelength of 460 nm were mounted at the specified position of the substrate for mounting light emitting elements by die bonding, and the blue LEDs and each conductive layer were connected by wire bonding using thin metallic wire. Next, epoxy resin dispersed with fluorescent material that generates yellow light after being excited by blue light was filled in the groove of the substrate, and cured. Each light emitting element was sealed, and a light emitting module for lighting apparatus that generates white light was manufactured.

Similarly, four manufactured light emitting modules were joined linearly by connecting each of them by connection terminals, direct current of 200 mA was supplied from the connection terminal of one end of the module, and all the light emitting modules were lit. The result was that all the light emitting modules emitted white light of the same luminance, and the light emitting modules on the power feed side and opposite side no longer became dark. After a light-up of one hour, the consumed power was about 19 W, and the temperature on the substrate surface as about 30° C. Thus, the heat dissipating ability was adequate.

In view of the above, it should be comprehended that the present invention may comprise various non-limiting embodiments that have not been disclosed herein. The invention is, therefore, encompassed in any of its forms or modifications within the proper scope of the appended claims.

The invention claimed is:

1. A substrate for mounting light emitting elements, comprising: an enameled substrate in which a surface of a core metal is covered with an enamel layer; two or more conductive layers formed on an outer surface of the enameled substrate; and an insulating layer provided between every two of the conductive layers, wherein the conductive layers extend along a longitudinal direction of the enameled substrate from a first end to a second end such that the conductive layers feed power to a plurality of light emitting elements mounted along the longitudinal direction of the enameled substrate, and such that the conductive layers form a laminate structure together with the insulating layer sandwiched therebetween; wherein the first and second end of the enameled substrate have at least one protruding section, wherein a first one of the conductive layers extends on a surface of a respective protruding section provided at each of the first and second ends of the enameled substrate to connect with another substrate, wherein a first portion of a second one of the conductive layers, on which the light emitting elements are mounted, is directly formed on the enamel layer which covers the surface of the core metal, and wherein a second portion of the second one of the conductive layers is mounted on top of the first one of the conductive layers via the insulating layer.

2. The substrate for mounting light emitting elements as recited in claim 1, wherein a groove is provided in the enameled substrate, and the first portion of the second one of the conductive layers extends within the groove such that the position for mounting the light emitting element is within the groove.

3. A light emitting module comprising light emitting elements which are mounted on the substrate for mounting light emitting elements as recited in claim 1.

4. A lighting apparatus comprising the light emitting module as recited in claim 3.

5. The substrate for mounting light emitting elements as recited in claim 1, wherein the second one of the conductive layers is Z-shaped in top view.

* * * * *